(12) United States Patent
Brunie

(10) Patent No.: US 11,489,544 B2
(45) Date of Patent: Nov. 1, 2022

(54) FAST CRC COMPUTATION CIRCUIT USING AN ON-THE-FLY RECONFIGURABLE GENERATOR POLYNOMIAL

(71) Applicant: Kalray, Montbonnot Saint Martin (FR)

(72) Inventor: Nicolas Brunie, Grenoble (FR)

(73) Assignee: Kalray, Montbonnot Saint Martin (FR)

( * ) Notice: Subject to any disclaimer, the term of this patent is extended or adjusted under 35 U.S.C. 154(b) by 38 days.

(21) Appl. No.: 17/217,640

(22) Filed: Mar. 30, 2021

(65) Prior Publication Data

US 2021/0306002 A1 Sep. 30, 2021

(30) Foreign Application Priority Data

Mar. 30, 2020 (FR) ...................................... 2003134

(51) Int. Cl.
*H03M 13/09* (2006.01)

(52) U.S. Cl.
CPC ................................. *H03M 13/091* (2013.01)

(58) Field of Classification Search
CPC combination set(s) only.
See application file for complete search history.

(56) References Cited

U.S. PATENT DOCUMENTS

| | | | |
|---|---|---|---|
| 7,320,101 B1 * | 1/2008 | Bain ................... | H03M 13/091 714/781 |
| 7,761,776 B1 * | 7/2010 | Bataineh ............. | H03M 13/091 714/781 |
| 2004/0059984 A1 * | 3/2004 | Cavanna ............. | H03M 13/617 714/758 |
| 2006/0168495 A1 * | 7/2006 | Dominic ............. | H03M 13/091 714/758 |
| 2006/0282743 A1 | 12/2006 | Kounavis | |
| 2009/0157784 A1 | 6/2009 | Gopal et al. | |
| 2014/0281844 A1 * | 9/2014 | Jiang ................... | H03M 13/091 714/807 |
| 2017/0063493 A1 * | 3/2017 | Mundhada .......... | H03M 13/091 |
| 2018/0175883 A1 * | 6/2018 | Kumar ................ | H03M 13/091 |
| 2019/0108093 A1 * | 4/2019 | Presman .............. | H03M 13/13 |

OTHER PUBLICATIONS

Feldmeier, "Fast Software Implementation of Error Detection Codes", IEEE/ACM Transactions on Networking, vol. 3, No. 6, Dec. 1995, 12 pages.

* cited by examiner

*Primary Examiner* — Steve N Nguyen

(57) ABSTRACT

A circuit for generating an N-bit cyclic redundancy code of a k-bit digit d, the code based on a reconfigurable generator polynomial P of degree N, the circuit including a dynamic table comprising a multiplication sub-table storing products resulting from multiplication by the polynomial P of each element definable over k bits, in the order of the scalar values of the k-bit elements; a division sub-table storing quotients resulting from Euclidean division by the polynomial P of each k-bit element shifted by N bits to the left, in the order of the scalar values of the k-bit elements; and a group of first multiplexers, each multiplexer connected to be indexed by a respective cell of the division table to transmit the contents of a corresponding cell of the multiplication table to an output of the dynamic table, of same rank as the respective cell of the division table.

7 Claims, 3 Drawing Sheets

FAST CRC COMPUTATION CIRCUIT USING AN ON-THE-FLY RECONFIGURABLE GENERATOR POLYNOMIAL

CROSS-REFERENCE TO RELATED APPLICATION

This application is based on and claims priority under 35 U.S.C. 119 to French Patent Application No. 20 03134 filed on Mar. 30, 2020, the disclosure of which is herein incorporated by reference in its entirety.

TECHNICAL FIELD

The invention relates to on-the-fly calculation of signatures or Cyclic Redundancy Codes (CRC) on a data stream.

BACKGROUND

CRC codes are used in particular to verify the integrity of data transmitted over a communication link, by comparing the code calculated at the destination with a code that has been inserted in the stream at the source.

In general, a CRC code computed on a binary message is the remainder of the division in a finite field of characteristic 2 $GF(2^N)$ of a polynomial representing the message by the generator polynomial of the finite field. More specifically, the CRC code is expressed in polynomial form by:

$$CRC(\{m\})=\{m\} \cdot X^N \bmod P,$$

Where $\{m\}$ is the binary message represented in polynomial form, P the generator polynomial, and N the degree of the generator polynomial.

Hereafter, the notation "$\{x\}$" is used to designate an element of the finite field or the polynomial representing the binary value of x, where x will sometimes be expressed by a scalar value. For example, $\{5\}$ is the finite field element corresponding to the binary value "101" or the polynomial $X^2+1$.

Communication links may be used today to serially transmit multiple nested streams according to different standards. The different standards may use CRC codes with different generator polynomials. Thus, the equipment receiving the streams should be able to process such data arriving at high speed by applying a suitable generator polynomial.

The calculation of a CRC code may be complex if the message and code sizes are large. To achieve a compromise between complexity and speed of computation, dedicated hardware operators rely on breaking down the message into small digits, and operate on the individual digits using tables populated according to the generator polynomial. The tables may contain partial calculation results or full CRC values. The codes calculated on the digits are then combined using recursion properties to calculate the code over the entire message. Such an operator is described, for example, in U.S. Pat. No. 6,223,320.

SUMMARY

A circuit for generating an N-bit cyclic redundancy code (CRC) of a k-bit digit d is generally provided, the code being based on a reconfigurable generator polynomial P of degree N, the circuit including a dynamic table comprising a multiplication sub-table storing products resulting from the multiplication by the polynomial P of each element definable over k bits, in the order of the scalar values of the k-bit elements; a division sub-table storing the quotients resulting from the Euclidean division by the polynomial P of each k-bit element shifted by N bits to the left, in the order of the scalar values of the k-bit elements; and a group of first multiplexers, each multiplexer being connected to be indexed by a respective cell of the division table to transmit the contents of a corresponding cell of the multiplication table to an output of the dynamic table, of same rank as the respective cell of the division table.

The circuit may further comprise a second multiplexer indexed by the digit d to transmit the output of corresponding rank of the dynamic table as the code of the digit d.

The division sub-table may comprise:
for each output of rank $2^i$ of the division sub-table, where i varies from 0 to k−1:
- a multiplexer indexed by i most significant bits of the generator polynomial and receiving on its inputs respectively the outputs of ranks 0 to $2^i-1$ of the division sub-table;
- a bit-to-bit exclusive-OR gate producing the output of rank $2^i$ of the division sub-table from the binary number $\{2^i\}$ and the output of the multiplexer associated with rank $2^i$; and for each output of rank j, where j varies from $(2^i+1)$ to $(2^{i+1}-1)$:
- a bit-to-bit exclusive-OR gate receiving the outputs of ranks $2^i$ and $j-2^i$ of the division sub-table.

The exclusive-OR gate associated with a rank $2^i$ may include wiring producing the output of rank $2^i$ such that the bit of weight i is set to 1 and the bits of weight less than i correspond to the output of the multiplexer associated with rank $2^i$.

For generating a CRC code on a data item formed by a digit d of k most significant bits and a digit d' of s least significant bits, the circuit may further comprise a third multiplexer indexed by a second s-bit digit to transmit the output of corresponding rank of the dynamic table; a first bit-to-bit exclusive-OR gate forming the second s-bit digit from the digit d' and the s most significant bits of the code of the digit d provided by the second multiplexer; and a second bit-to-bit exclusive-OR gate receiving the N-s least significant bits of the code of the digit d and the N-s most significant bits of the output of the third multiplexer, the code of the data item being formed by the N-s most significant bits of the output of the second exclusive-OR gate and the s least significant bits of the output of the third multiplexer.

A method is also provided for generating the division sub-table, comprising the following steps:
for i varying from 0 to k−1:
- generating the output of rank $2^i$ as a bit-to-bit exclusive-OR operation between the binary number $\{2i\}$ and an output of previous rank defined by i most significant bits of the generator polynomial; and for j varying from $(2^i+1)$ to $(2^{i+1}-1)$:
- generating the output of rank j by a bit-to-bit exclusive-OR operation between the outputs of ranks $2^i$ and $j-2^i$.

A method is also provided for generating the multiplication sub-table, comprising the following steps:
for i varying from 0 to k−1:
- generating the output of rank $2^i$ by shifting the generator polynomial by i positions to the left; and for j varying from $(2^i+1)$ to $(2^{i+1}-1)$:
- generating the output of rank j by a bit-to-bit exclusive-OR operation between the outputs of ranks $2^i$ and $j-2^i$.

BRIEF DESCRIPTION OF THE DRAWINGS

Embodiments will be exposed in the following description provided for exemplary purposes only, in relation to the attached figures, in which.

DETAILED DESCRIPTION

In the present disclosure, to compute a CRC code on a message, it is proposed to use a CRC value table that is dynamically reconfigurable according to a generator polynomial, and this in one cycle of a data transmission clock, or at least in a reduced number of cycles compatible with a pipelined operation. For this purpose, the table, although behaving externally as a static table storing fixed values, has a dynamic internal structure in combinatorial logic that generates the table values in response to the generator polynomial P supplied as the only parameter to the table.

To achieve a sufficiently fast reconfiguration in response to a change of the generator polynomial, the table includes two dynamic sub-tables whose values are generated in response to the generator polynomial applied as parameter. The two sub-tables are configured so that the values of one operate a selection of the values of the other.

Figure 1:
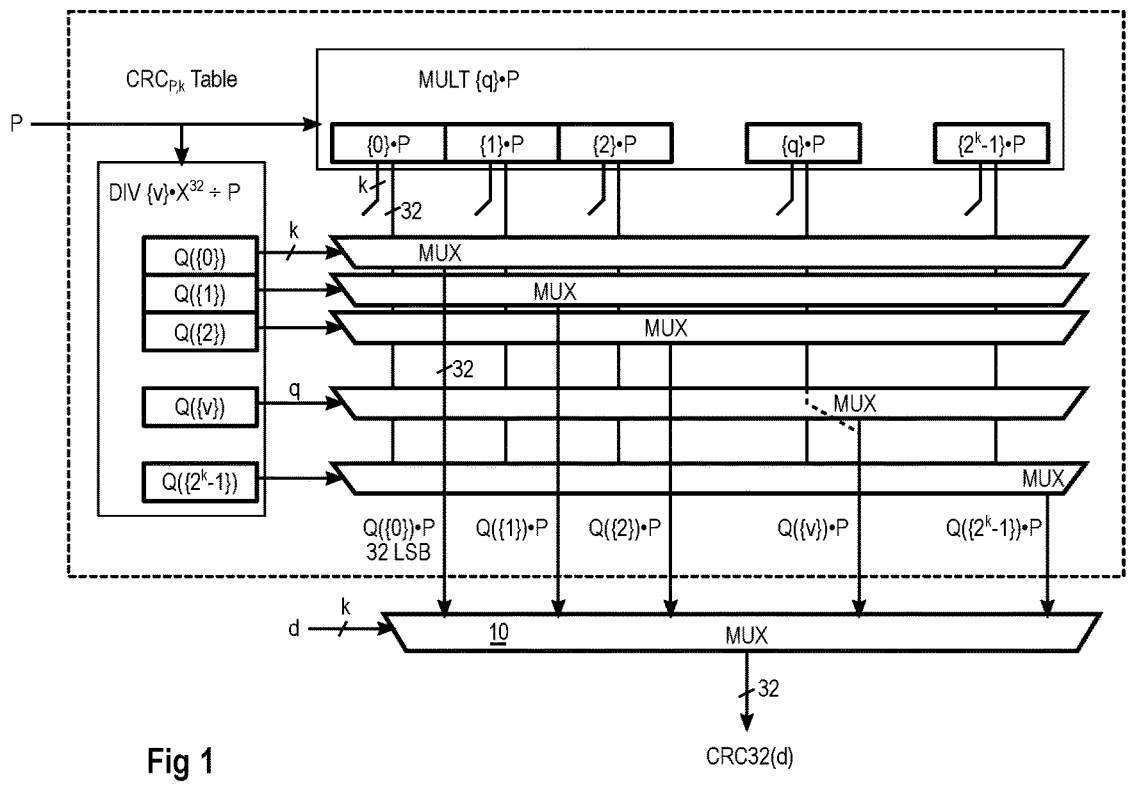
FIG. 1 illustrates a block diagram of an embodiment of a CRC computing operator using a reconfigurable dynamic table based on the generator polynomial.

FIG. 1 illustrates this structure in more detail, in the context of calculating a 32-bit CRC code for a k-bit digit d. The dynamic table is noted $CRC_{P,k}$, where P is the generator polynomial, here of degree N=32, and k the number of bits of digit d for which the code is calculated.

A first sub-table, or multiplication table MULT, contains the multiples $\{q\} \cdot P$ of the polynomial P by all the elements $\{q\}$ definable over k bits, i.e., the elements of $GF(2^k)$. The multiples are organized in the table in the order of the scalar values q of the elements $\{q\}$.

Thus, the table MULT is shown as containing, in order, the products $\{0\} \cdot P, \{1\} \cdot P, \{2\} \cdot P \ldots \{q\} \cdot P \ldots \{2^k-1\} \cdot P$.

Each product being the result of the multiplication of a polynomial of degree 32 by a polynomial of degree k−1, the product is a polynomial of degree k+31, i.e., a number of k+32 bits. For the purposes of calculating a 32-bit code, it turns out that only the 32 least significant bits of the products may be stored, since the code is taken from the remainder of a division, where only the least significant bits matter. Thus, as illustrated by disconnected lines, the k most significant bits of the products are ignored (and are not stored). As a further result, the term of degree 32 of polynomial P, which corresponds to a bit of rank 33 always at 1, is also omitted.

A second sub-table, a division table DIV, contains the quotients Q produced from the Euclidean divisions of the polynomials $\{v\} \cdot X^{32}$ by the polynomial P, where $\{v\}$ assumes all the elements of $GF(2^k)$. (An element $\{v\} \cdot X^{32}$, in binary, is none other than the binary value $\{v\}$ shifted to the left by 32 bits, i.e., a binary value of k+32 bits of which the 32 least significant bits are all zero). The quotients are noted $Q(\{0\}), Q(\{1\}) \ldots Q(\{v\}) \ldots Q(\{2^k-1\})$, and they are organized in the order of the scalar values v of the elements $\{v\}$. The quotients are binary values encoded over k bits.

Each cell $Q(\{v\})$ of the division table DIV is associated with an output of rank v of the global table $CRC_{P,k}$. The scalar value q of the content of a cell $Q(\{v\})$ is used to select the cell of rank q of the multiplication table MULT, and to transfer the content $\{q\} \cdot P$ of this cell to the output of rank v of the global table (as shown by dotted lines between row v and column q). Thus, an output of rank v provides the product $\{q\} \cdot P = Q(\{v\}) \cdot P$, whose 32 least significant bits, according to CRC properties, also turn out to be the remainder of the division, i.e. the searched CRC code of $\{v\}$.

According to the shown embodiment, to perform this switching functionality, the content q of a cell $Q(\{v\})$ serves as an index to a respective multiplexer whose output forms the output of rank v of the global table. The multiplexer receives the contents of the cells of the table MULT on its respective inputs, in the order of the ranks of the cells of the table MULT.

To produce the CRC code of a given k-bit digit d, a multiplexer 10 is provided which takes the digit d as an index and which receives on its respective inputs the outputs of the global table, in the order of the ranks of these outputs.

The table $CRC_{P,k}$ has a relatively complex structure if only one generator polynomial P were to be used. Indeed, in this case, it would be sufficient to store only the values $Q(\{0\}) \cdot P$ to $Q(\{2^k-1\}) \cdot P$. The additional complexity makes sense when the polynomial P is arbitrarily variable, because this particular choice of partitioning into sub-tables allows an on-the-fly update of these sub-tables when the polynomial changes, using relatively simple and fast hardware means, as described below.

Figure 2:
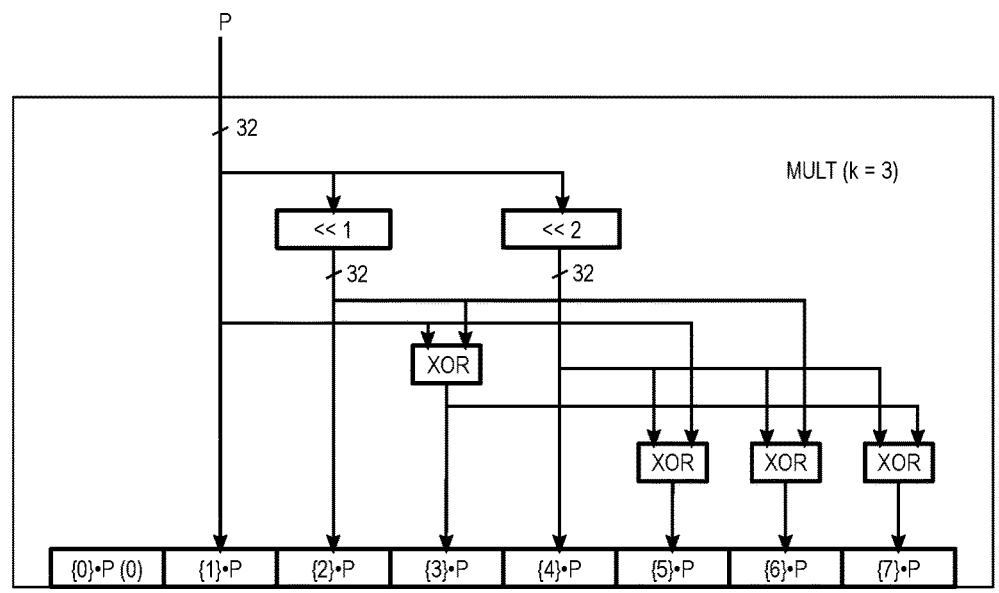
FIG. 2 illustrates a block diagram of an exemplary multiplication sub-table incorporated in the dynamic table of FIG. 1.

FIG. 2 shows a more detailed diagram of an optimized example of a multiplication table MULT dynamically configurable by the polynomial P, for k=3. To build such a table in combinatorial logic in a trivial way, each output $\{i\} \cdot P$ could be produced by adding P to the previous output $\{i-1\} \cdot P$, the addition being a bit-by-bit exclusive-OR operation. However, this would cascade up to $2^k-1$ exclusive-OR gates between the first output and the last output, forming a substantial critical path in the corresponding combinatorial logic circuit.

The following recursive rule significantly reduces the critical path in the combinatorial logic. It is recalled that, for the purposes of CRC code computations, the values in binary are truncated to the 32 least significant bits and the term in $X^{32}$ of the polynomial P is omitted.

$$\{0\} \cdot P = \{0\}$$

For i varying from 0 to k−1:

$$\{2^i\} \cdot P = P << i$$

Namely, the bits of the binary representation of the polynomial P are shifted to the left by i positions, padding the i bits created to the right with zeros and discarding the i bits overflowing to the left.

For j varying from $(2^i+1)$ to $(2^{i+1}-1)$:

$$\{j\} \cdot P = \{2i\} \cdot P \text{ xor } \{j-2i\} \cdot P,$$

Where "xor" refers to a bit-by-bit exclusive-OR operation, i.e., the addition operation in the finite field.

The decomposition $j=(2^i)+(j-2^i)$ allows in this iteration step to reuse two previously calculated terms relatively close in rank, so as to use as few exclusive-OR gates in series as possible.

The diagram of FIG. 2 is a direct transcription into digital circuit elements of this recursive rule for k=3, according to which the following decomposition is obtained:

$$\{0\}\cdot P=\{0\}$$

$$\{1\}\cdot P=P<<0=P$$

$$\{2\}\cdot P=P<<1$$

$$\{3\}\cdot P=\{2\}\cdot P \text{ xor } \{1\}\cdot P$$

$$\{4\}\cdot P=P<<2$$

$$\{5\}\cdot P=\{4\}\cdot P \text{ xor } \{1\}\cdot P$$

$$\{6\}\cdot P=\{4\}\cdot P \text{ xor } \{2\}\cdot P$$

$$\{7\}\cdot P=\{4\}\cdot P \text{ xor } \{3\}\cdot P$$

The left shift elements "<<1" and "<<2" are realized by simple cross wiring, and do not introduce any delay. It is apparent that the critical path has at most two exclusive-OR gates XOR, that of output $\{3\}\cdot P$ followed by that of output $\{7\}\cdot P$, instead of 6 gates for a trivial structure between output $\{1\}\cdot P$ and output $\{7\}\cdot P$.

Figure 3A:
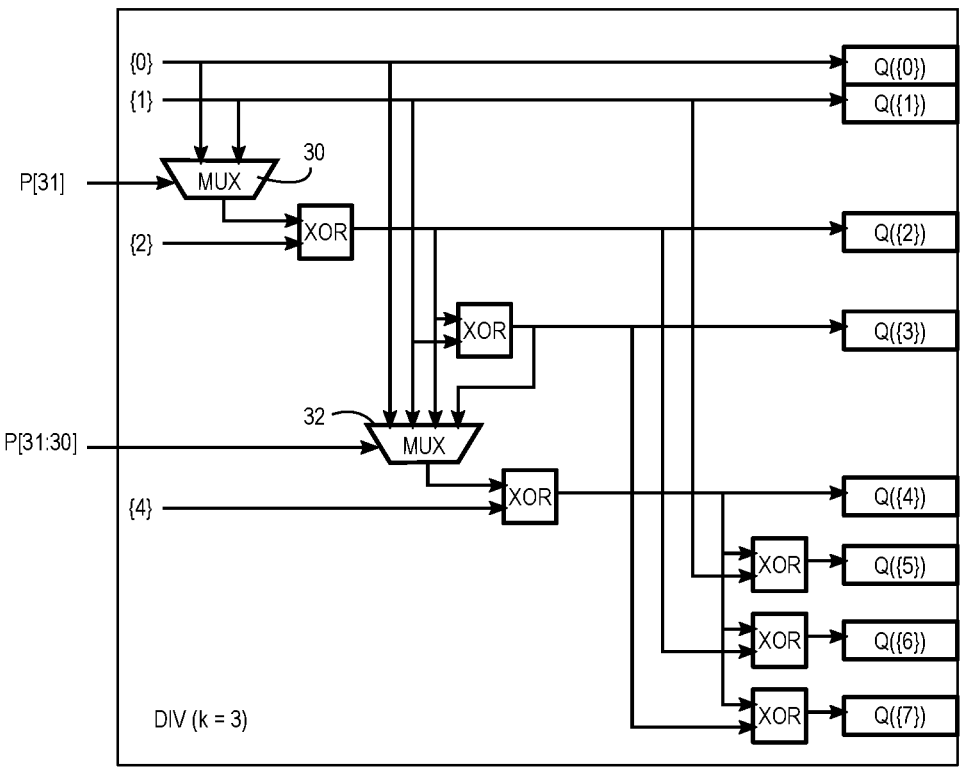
FIG. 3A illustrates a block diagram of an exemplary division sub-table incorporated in the dynamic table of FIG. 1.

FIG. 3A shows a more detailed diagram of an optimized example of a division table DIV dynamically configurable by the polynomial P, for k=3. The iterative construction rule used is the following. Only terms of degree less than or equal to 31 of the polynomial P are considered, i.e., 32 bits.

$$Q(\{0\})=\{0\}$$

For i varying from 0 to k−1:

$$Q(\{2i\})=\{2i\} \text{ xor } Q(P>>32-i),$$

Where P>>32−i, i.e., the binary representation of the polynomial P shifted to the right by 32−i positions (without the term $X^{32}$), is a concise notation to express that only the i most significant bits of P are kept.

For j varying from $(2^i+1)$ to $(2^{i+1}-1)$:

$$Q(\{j\})=Q(\{2^i\}) \text{ xor } Q(\{j-2^i\}).$$

The diagram of FIG. 3A is a direct transcription into digital circuit elements of this recursive rule for k=3, according to which the following decomposition is obtained, where the quotients are coded over k=3 bits:

$$Q(\{0\})=\{0\}$$

$$Q(\{1\})=\{1\} \text{ xor } Q(P>>32)=\{1\} \text{ xor } Q(\{0\})=\{1\}$$

$$Q(\{2\})=\{2\} \text{ xor } Q(P>>31)=\{2\} \text{ xor } Q(P[31])$$

$$Q(\{3\})=Q(\{2\}) \text{ xor } Q(\{1\})$$

$$Q(\{4\})=\{4\} \text{ xor } Q(P>>30)=\{4\} \text{ xor } Q(P[31:30])$$

$$Q(\{5\})=Q(\{4\}) \text{ xor } Q(\{1\})$$

$$Q(\{6\})=Q(\{4\}) \text{ xor } Q(\{2\})$$

$$Q(\{7\})=Q(\{4\}) \text{ xor } Q(\{3\})$$

The terms Q(P[31]) and Q(P[31:30]), contrary to the other terms of the calculations, are not locatable in the table independently of the polynomial P—they indeed depend on the individual bits of the polynomial applied to the table. Thus, the quotients Q({2}) and Q({4}) which respectively depend thereon have, in their generation path, a multiplexer MUX which selects the quotient to be used according to the polynomial P applied.

More specifically, to provide the term Q(P[31]) involved in the generation of the quotient Q({2}), a multiplexer 30 indexed by bit P[31] receives on its inputs, in order, the constants {0} and {1}, which are also the outputs Q({0}) and Q({1}) of the table. In fact, this multiplexer could be omitted by providing for Q(P[31]) directly the bit P[31] as the least significant bit of a number of k=3 bits.

To provide the term Q(P[31:30]) involved in the generation of the quotient Q({4}), a multiplexer 32 indexed by bits P[31:30] receives on its inputs, in order, the outputs Q({0}) to Q({3}) of the table.

For a higher value of k, the first elements shown are unchanged. The next quotient Q({8}) to be generated is expressed by:

$$Q(\{8\})=\{8\} \text{ xor } Q(P[31:29]).$$

The term Q(P[31:29]) is embodied by a multiplexer indexed by the three bits P[31:29] and receiving on its inputs respectively the quotients Q({0}) to Q({7}), in fact all the quotients preceding Q({8}).

The following quotients Q({9}) to Q({15}) are relatively simple to generate, each being an exclusive-OR combination of two previous quotients statically locatable in the table according to the second step of the iterative rule.

The following quotient Q({16}) involves the term Q(P[31:28]) which is embodied by a multiplexer indexed by the four bits P[31:28] and which receives on its inputs respectively the quotients Q({0}) to Q({15}). And so on.

Given that the XOR gates associated with the outputs of the multiplexers have an input receiving a value ({2}, {4}) having a single fixed bit at 1 and an input receiving a value having significant bits of lower order, these gates are not necessary in practice. In fact, their function may be obtained by simply juxtaposing the wires conveying the bits of the two inputs of the XOR gate.

Figure 3B:
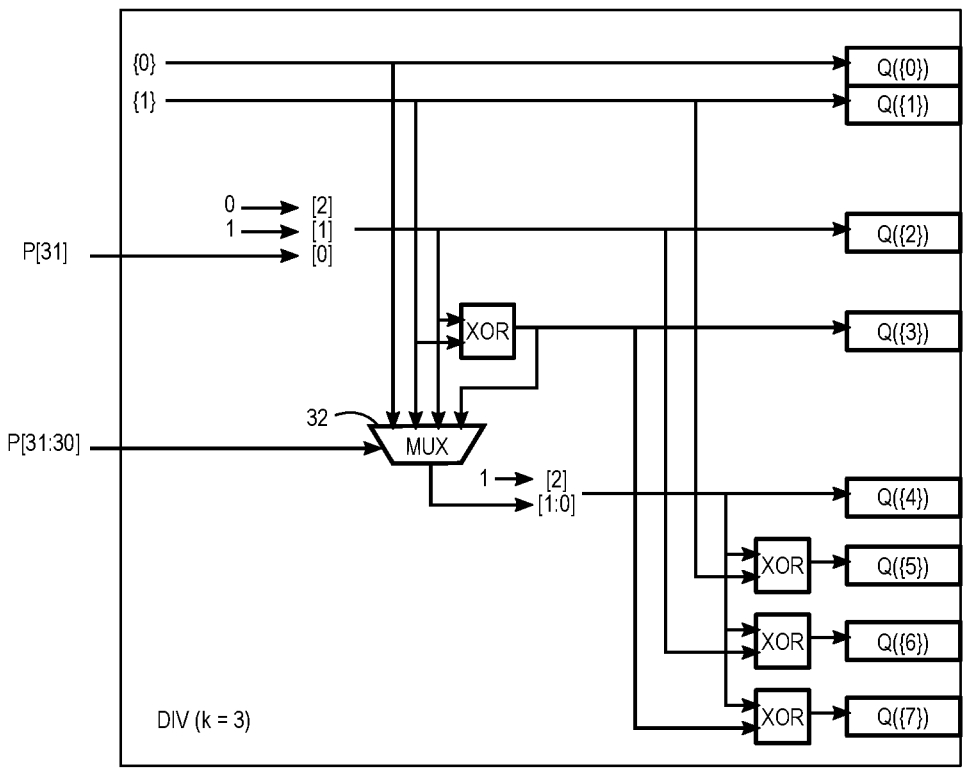
FIG. 3B illustrates a wiring simplification of the structure of FIG. 3A.

FIG. 3B illustrates a simplified structure resulting from this property. The quotient Q({2}) is formed from bits 0, 1 and P[31], by decreasing order of significance, while the quotient Q({4}) is formed from bit 1 and the two output bits of the multiplexer associated with this quotient.

Given the structure of the CRC table in FIG. 1, its size increases quadratically with $2^k$. It may therefore be desirable to obtain a compromise between operator complexity and computation speed, by exploiting CRC computation properties.

Figure 4:
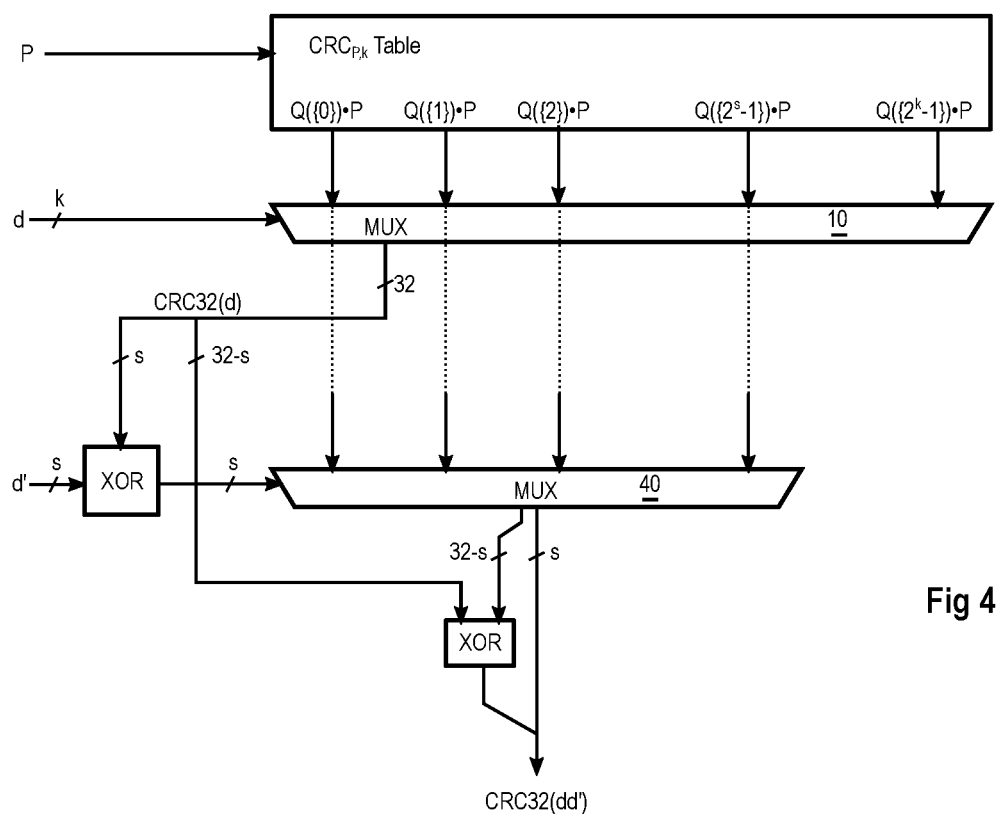
FIG. 4 illustrates a block diagram of a CRC calculation operator extended to several digits of a message, exploiting the structure of FIG. 1 multiple times.

FIG. 4 illustrates an application of a table $CRC_{P,k}$ initially adapted to a k-bit digit (like the one of FIG. 1) to compute the CRC code over an extended digit dd' of k+s bits. It is assumed that the extended digit dd' is composed of a high order k-bit digit d and a low order s-bit digit d'. In the example, it is assumed that s is less than or equal to k.

This circuit uses the property that a CRC code can be calculated recursively over consecutive digits of a message to form the code of the complete message. The circuit in FIG. 4 is designed to perform two iterations simultaneously in combinatorial logic.

More specifically, the recursive relation used is the following, bearing in mind that bit shifting operates in a 32-bit window, such that the bits leaving the window are discarded and the bits entering the window are set to 0.

$$CRC(dd')=(CRC(d)<<s) \text{ xor } CRC(d')>>(32-s))$$

The structure of FIG. 1 is fully reproduced, i.e. the table $CRC_{P,k}$ and the multiplexer 10, to generate an intermediate code CRC32(d) of the digit d.

The digit d' and the s most significant bits of the code CRC32(d) are combined by an XOR gate that controls a multiplexer 40. The multiplexer 40 is connected in parallel with the multiplexer 10 on the first $2^s$ outputs of the table $CRC_{P,k}$.

The 32−s least significant bits of code CRC32(d) and the 32−s most significant bits of the output of multiplexer 40 are combined by an XOR gate to form the 32−s most significant bits of the CRC code of the extended digit dd'. The s least significant bits of this code are formed by the s least significant bits of the output of multiplexer 40.

Thus, a single CRC table may be used to compute the CRC code of a number up to twice as long (with s=k), with little increase in complexity.

Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claims scope. The scope of patented subject matter is defined by the claims.

What is claimed is:

1. A circuit for generating an N-bit cyclic redundancy code (CRC) of a k-bit digit d, the code being based on a reconfigurable generator polynomial P of degree N, the circuit including a dynamic table comprising:
    a multiplication sub-table connected to receive the generator polynomial in binary form and providing, on respective outputs, products resulting from the multiplication by the polynomial P of each element definable over k bits, ordered by scalar values of the k-bit elements;
    a division sub-table connected to receive the generator polynomial in binary form and providing, on respective outputs, quotients resulting from Euclidean division by the polynomial P of each k-bit element shifted by N bits to the left, ordered by the scalar values of the k-bit elements; and
    a group of first multiplexers each multiplexer being connected to be indexed by a respective output of the division table to transmit the contents of a corresponding output of the multiplication table to an output of the dynamic table, of same rank as the respective output of the division table.

2. The circuit of claim 1, further comprising:
    a second multiplexer indexed by the digit d to transmit the output of corresponding rank of the dynamic table as the code of the digit d.

3. The circuit of claim 2 for generating a CRC code on a data item formed by a digit d of k most significant bits and a digit d' of s least significant bits, further comprising:
    a third multiplexer indexed by a second s-bit digit to transmit the output of corresponding rank of the dynamic table;
    a first bit-to-bit exclusive-OR gate forming the second s-bit digit from the digit d' and the s most significant bits of the code of the digit d provided by the second multiplexer; and
    a second bit-to-bit exclusive-OR gate receiving the N-s least significant bits of the code of the digit d and the N-s most significant bits of the output of the third multiplexer, the code of the data item being formed by the N-s most significant bits of the output of the second exclusive-OR gate and the s least significant bits of the output of the third multiplexer.

4. The circuit of claim 1, wherein the division sub-table is configured to:
    for i varying from 0 to k−1:
    generate the output of rank $2^i$ as a bit-to-bit exclusive-OR operation between the binary number {2i} and an output of previous rank defined by i most significant bits of the generator polynomial; and
    for j varying from $(2^i+1)$ to $(2^{i+1}-1)$:
    generate the output of rank j by a bit-to-bit exclusive-OR operation between the outputs of ranks $2^i$ and $j-2^i$.

5. The circuit of claim 4, wherein the division sub-table comprises:
    for each output of rank $2^i$ of the division sub-table, where i varies from 0 to k−1:
    a multiplexer indexed by i most significant bits of the generator polynomial (P) and receiving on its inputs respectively the outputs of ranks 0 to $2^i-1$ of the division sub-table;
    a bit-to-bit exclusive-OR gate producing the output of rank $2^i$ of the division sub-table from the binary number $\{2^i\}$ and the output of the multiplexer associated with rank $2^i$; and
    for each output of rank j, where j varies from $(2^i+1)$ to $(2^{i+1}-1)$:
    a bit-to-bit exclusive-OR gate receiving the outputs of ranks $2^i$ and $j-2^i$ of the division sub-table.

6. The circuit of claim 5, wherein the exclusive-OR gate associated with a rank $2^i$ includes wiring producing the output of rank $2^i$ such that the bit of weight i is set to 1 and the bits of weight less than i correspond to the output of the multiplexer associated with rank $2^i$.

7. The circuit of claim 1, wherein the multiplication sub-table is configured to:
    for i varying from 0 to k−1:
    generate the output of rank $2^i$ by shifting the generator polynomial by i positions to the left; and
    for j varying from $(2^i+1)$ to $(2^{i+1}-1)$:
    generate the output of rank j by a bit-to-bit exclusive-OR operation between the outputs of ranks $2^i$ and $j-2^i$.

* * * * *